United States Patent [19]

Ruffner et al.

[11] 4,118,120
[45] Oct. 3, 1978

[54] PAGE MODEL FOR PRINTING

[75] Inventors: Frederick G. Ruffner, 611 University Pl., Grosse Pointe, Mich. 48230; Frank E. Bair, Livonia, Mich.

[73] Assignee: Frederick G. Ruffner, Grosse Point, Mich.

[21] Appl. No.: 802,208

[22] Filed: May 31, 1977

[51] Int. Cl.² ............................................. G03B 27/62
[52] U.S. Cl. .................................... 355/75; 40/10 D; 211/55; 211/128; 354/292; 355/64
[58] Field of Search ....................... 355/39, 54, 64, 65, 355/75; 40/10 D, 19.5, 104.03, 104.19, 106.1, 124, 124.4, 156, 159; 354/292; 211/55, 135, 128

[56] References Cited

U.S. PATENT DOCUMENTS 4,055,381  10/1977  Lauer et al. ............................. 355/75

FOREIGN PATENT DOCUMENTS 1,084,264  7/1954  France ....................................... 355/75
1,287,675  9/1972  United Kingdom ....................... 355/75
1,427,027  3/1976  United Kingdom ....................... 355/75

Primary Examiner—Richard A. Wintercorn
Attorney, Agent, or Firm—Reising, Ethington, Barnard, Perry & Brooks

[57] ABSTRACT

A page model used to photographically prepare printing plates incorporates a mounting sheet on which cards for receiving printed matter are slidably secured by card edge retainers on the front side of the mounting sheet. Different embodiments disclosed have the card edge retainers formed as slits in the mounting sheet and transparent retaining strips secured to the front side of the mounting sheet. A retaining sheet secured to the back side of the mounting sheet or tape is utilized to secure card edges inserted through the slits to the back side of the mounting sheet. Strips of transparent double-sided tape secure the transparent retaining strips to the front side of the mounting sheet. A strip of adhesive material, wax as disclosed, cooperates with the card retainers to secure the cards. Nonphotographic horizontal and vertical indicia on the front side of the mounting sheet and the front sides of the cards is provided for use in aligning the cards.

22 Claims, 9 Drawing Figures

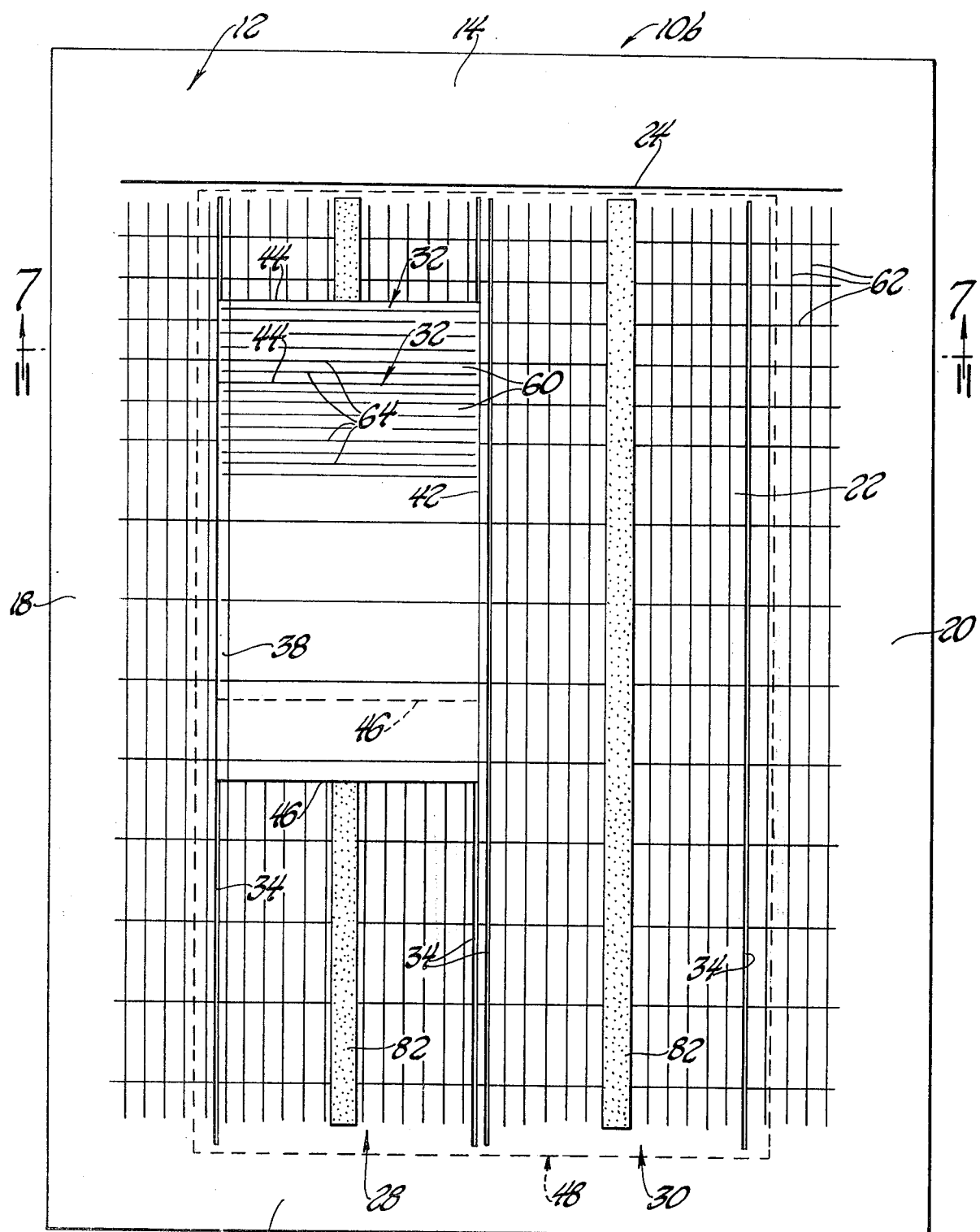
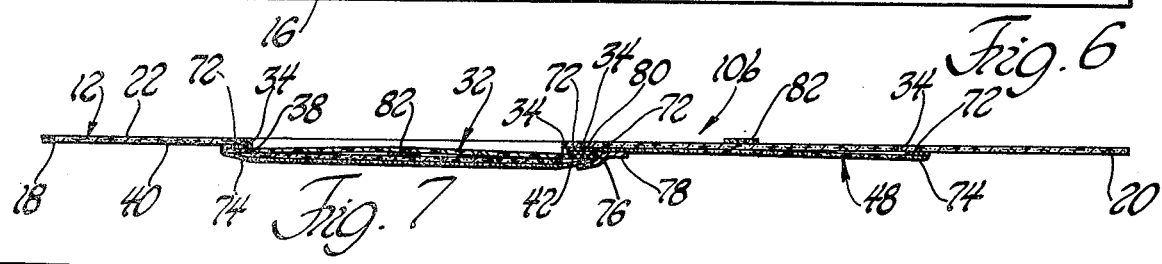

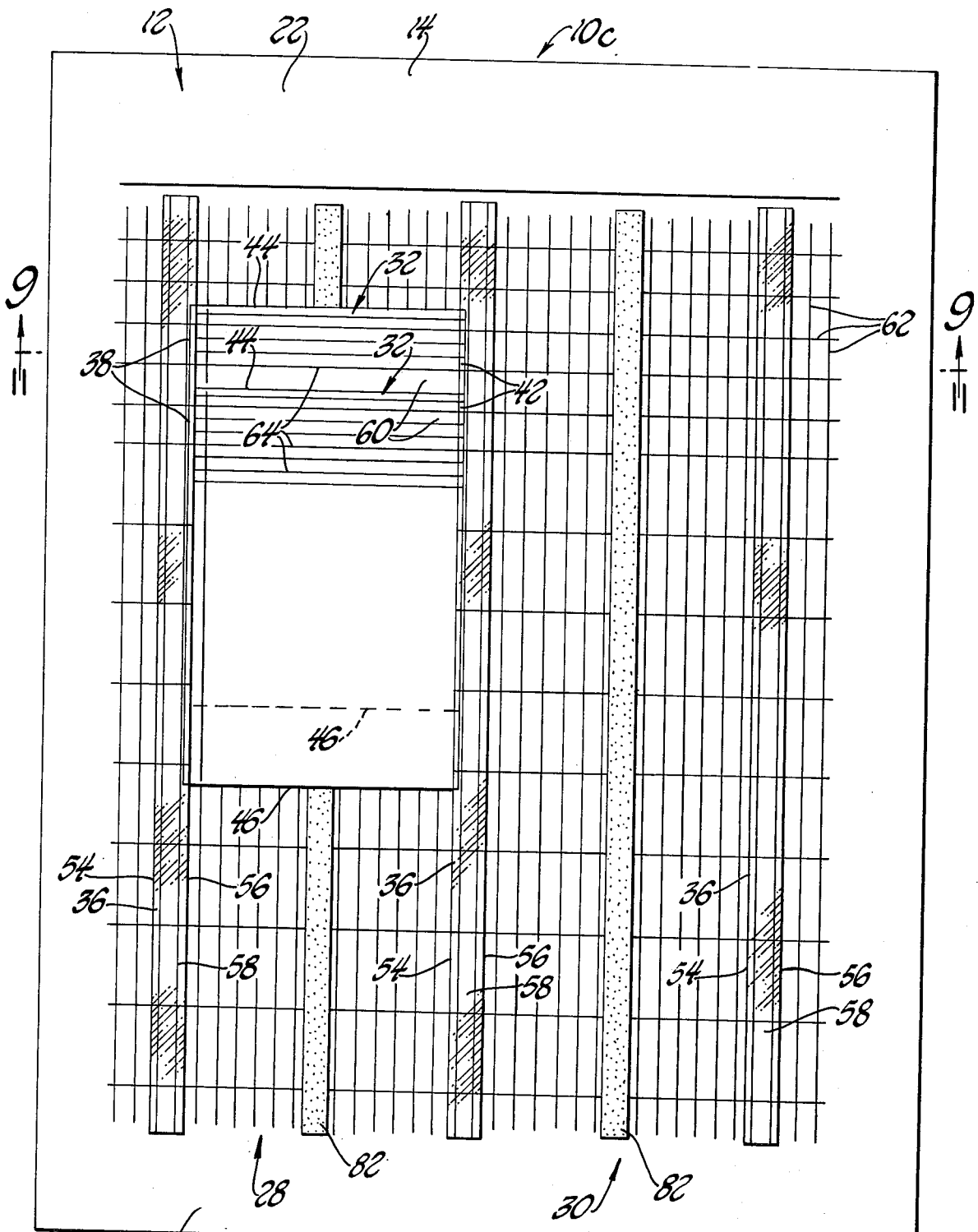
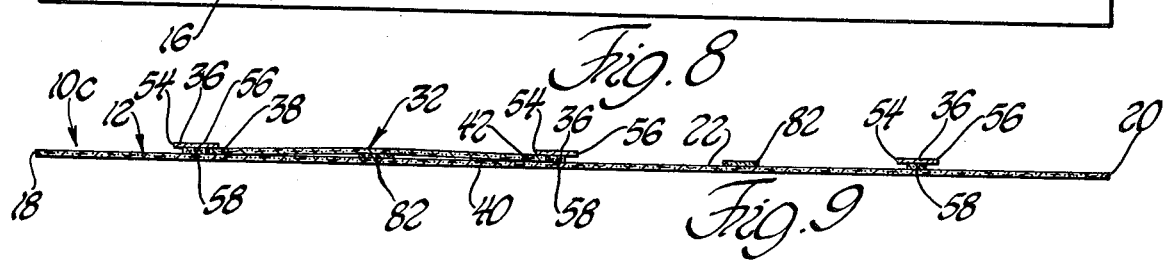

PAGE MODEL FOR PRINTING

BACKGROUND OF THE INVENTION

1. Field of the Invention

This invention relates to a page model that is used to photographically prepare printing plates such as those used in photo offset printing.

2. Description of the Prior Art

One way of printing plates can be prepared uses a photographic process in which a page model is first assembled and then photographed to capture the image that will be printed. Photographically preparing plates is an economical way of preparing printing plates without a large capital investment in plate manufacturing equipment. This feature makes photographically prepared printing plates desirable for use in printing. When printing plates are photographically prepared by use of a page model, there is no necessity to compile the printed page manually or with a type compiling machine and a further cost savings is thus achieved, especially when printing low volume publications such as some newspapers, magazines, reference books, etc.

Page models are conventionally prepared by pasting or gluing pieces of paper with printing thereon onto a mounting sheet. Care must be taken to insure proper vertical alignment of the printing on the mounting sheet as well as a uniform vertical spacing between different items. The sheets of paper which are secured to the mounting sheet are either prepared by typing or by cutting pages from old works. Since the printed sheets of paper are glued or pasted onto the mounting sheet, there usually can be no reuse of the printed items in subsequently printed publications.

SUMMARY OF THE INVENTION

An object of the present invention is to provide an improved page model for use in photographically preparing printing plates so that cards with printed matter thereon can rapidly and economically be secured to a mounting sheet in a properly aligned manner along a vertical column or columns and removed from the mounting sheet after photographic preparation of the printing plates so that the cards can be reused with subsequently printed publications.

In carrying out the above object, the page model of the invention includes a mounting sheet whose front side has card edge retainers thereon for slidably supporting lateral edges of the cards so each card can be positioned vertically just below the printed matter on the next higher card. When mounted, cards that are not completely filled between their top and bottom edges with printed matter are overlapped by the next lower card or cards and secured in position by the card retainers.

Two preferred embodiments of the page model each include a mounting sheet with front and back sides and card retainers for each vertical column in the form of a vertically extending slit in the mounting sheet and an associated transparent retaining strip secured to the front side of the mounting sheet extending vertically parallel to the slit in a spaced relationship. A free edge of the retaining strip faces the slit and is movable away from the mounting sheet. During securement of cards with front sides having printed matter thereon, a first lateral edge of each card is inserted through the slit in the mounting sheet and a second lateral card edge is inserted between the free edge of the retaining strip and the mounting sheet so as to thereby provide positioning of the card on the mounting sheet. Any number of vertical columns can be composed on the mounting sheet with each column having an associated slit and transparent retaining sheet for securing the cards of the column.

The page model embodiments having the cooperable slit and transparent retaining strip card retainers each include provisions for retaining the card edges which are inserted through the mounting sheet slit to the back side of the mounting sheet. In one embodiment, a retaining sheet is secured to the back side of the mounting sheet and bonded thereto along an elongated area parallel to the slit in a spaced relationship thereto on the opposite lateral side of the slit from the retaining strip. When more than one column of cards is secured to the mounting sheet, there will be additional bonded areas of the retaining sheet to the back side of the mounting sheet. In the other embodiment, tape is used to secure the edges of the card inserted through the slit to the back side of the mounting sheet.

Another preferred embodiment of the page model includes card edge retainers for each vertical column in the form of a pair of vertical slits through the mounting sheet. Folds of a retaining sheet secured to the back side of the mounting sheet receive the card edges and cooperate with the slits in securing the cards. Between two adjacent vertical columns, the retaining sheet has a double fold with a slit therethrough extending vertically parallel to the other slits so that the cards of each column can have their adjacent edges received by the double fold and secured in cooperation with the slits in the mounting sheet.

A further preferred embodiment has each card edge retainer formed as a vertically extending transparent retaining strip secured to the front side of the mounting sheet. Free edges of the transparent retaining strips are movable away from the mounting sheet to secure the adjacent card edges therebetween. A transparent retaining strip located between adjacent vertical columns of the mounting sheet have a pair of free edges which function to secure the adjacent card edges of the two vertical columns.

Each transparent retaining strip is disclosed as being secured to the front side of the mounting sheet by a strip of transparent double-sided tape. During insertion of the card edges between the retaining strip and the mounting sheet, the double-sided tape provides a stop that aligns the card edges with each other along a vertical line. Each card is also movable vertically to provide proper spacing between the printed matter on the cards.

A strip of adhesive material cooperates with the card edge retainers in securing the cards. The adhesive material is disclosed as being wax applied as a strip to the front side of the mounting sheet between the card edge retainers. After securement of the cards by the edge retainers, pressure applied to the cards along the wax provides the additional card retention.

Nonphotographic horizontal and/or vertical indicia on the front side of the mounting sheet and the front sides of the cards are provided to insure proper alignment of the cards with respect to the mounting sheet and each other. The top end of the mounting sheet and the right card edge portions may have the indicia thereon spaced closer than on the rest of the sheet and the cards so as to enhance the ability of aligning the cards during composition of the page model.

BRIEF DESCRIPTION OF THE DRAWINGS

FIG. 6 is a front view of a further page model embodiment constructed according to the present invention;

FIG. 7 is a sectional view taken through the page model along line 7—7 of FIG. 6; along FIG. 8 is a front view of a still further embodiment of a page model constructed according to the present invention; and FIG. 9 is a sectional view of the page model taken along line 9—9 of FIG. 8.

DETAILED DESCRIPTION OF THE PREFERRED EMBODIMENTS

Figure 1:
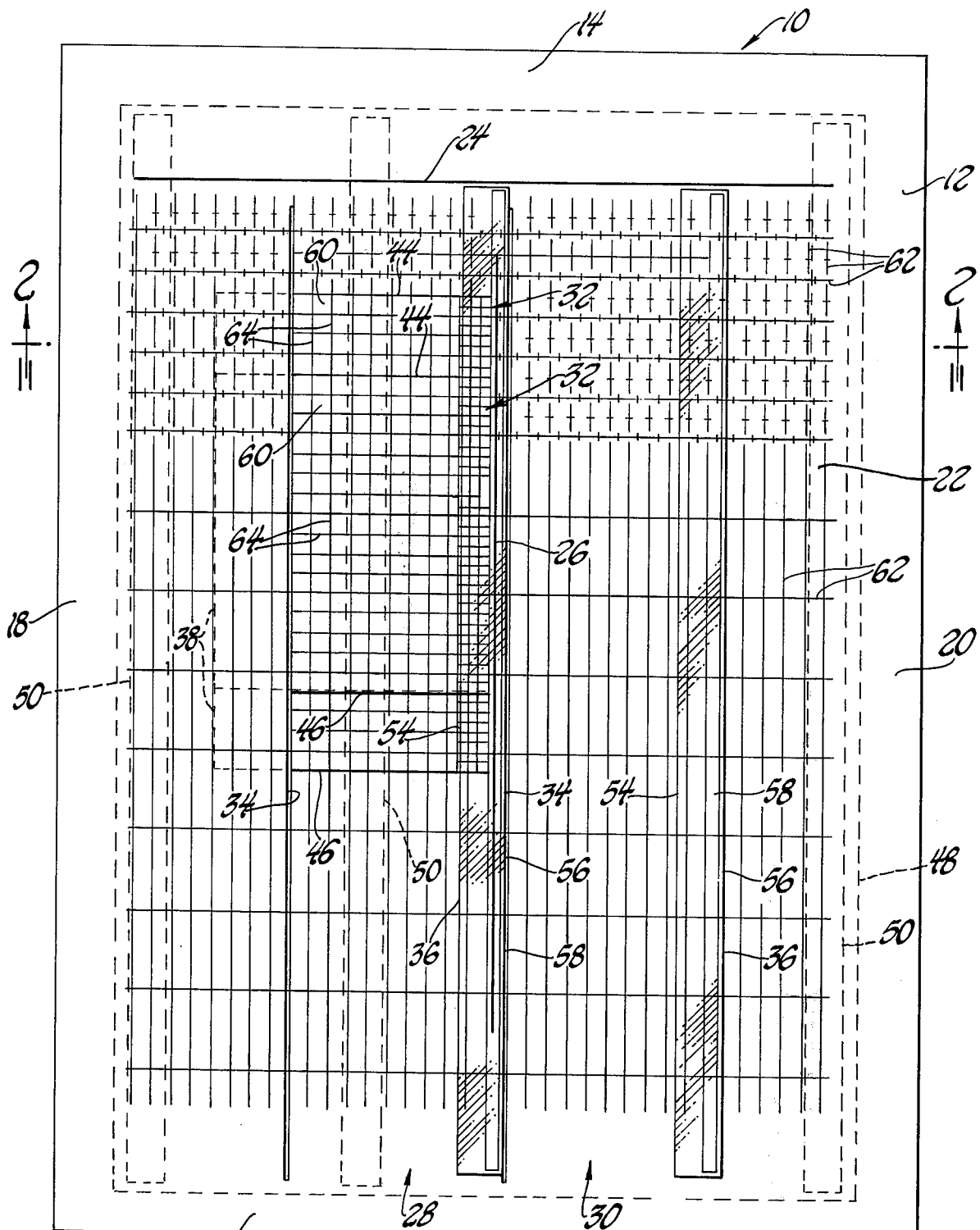
FIG. 1 is a front view of one embodiment of a page model according to the present invention.

Referring to FIG. 1 of the drawings, a page model for use in photographically preparing printing plates is constructed according to the present invention and indicated collectively by reference numeral 10. A mounting sheet 12 of the page model has a generally rectangular shape with top and bottom ends 14 and 16 as well as left and right sides 18 and 20. On a front side 22 of the mounting sheet, a horizontal line 24 is provided adjacent the top sheet end 14 in order to underline a heading of the page model and a vertical line 26 extends downwardly from the horizontal line to divide the page into a pair of vertical columns 28 and 30. Cards 32 are secured to the front sheet side 22 along the columns 28 and 30 during composition of the page model so that printed matter on the cards can be photographed after the page model is completely composed in order to prepare printing plates. Although the page model 10 as disclosed is constructed to retain the cards 32 along the two columns 28 and 30, it can also be constructed to retain cards along one, three, or more vertical columns in the manner which is hereinafter more fully described.

Figure 2:
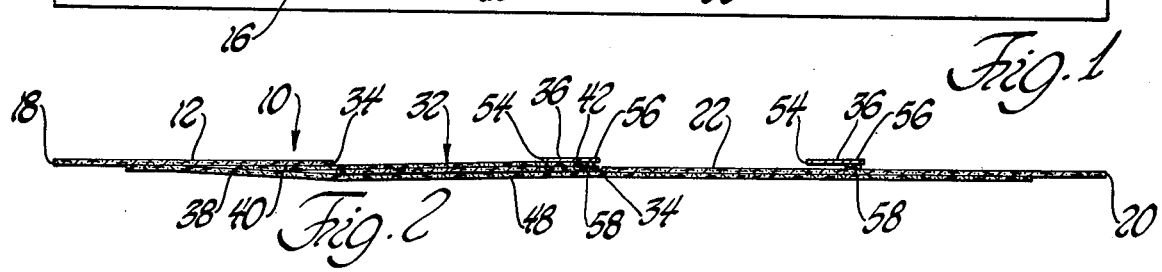
FIG. 2 is a sectional view of the page model taken along line 2—2 of FIG. 1.

As can be seen by combined reference to FIGS. 1 and 2, card edge retainers in the form of a vertically extending slit 34 and a transparent retaining strip 36 associated with each vertical column 28 and 30 are utilized in securing the cards 32 to the front side of the mounting sheet. Each card 32 has a left lateral edge 38 that is inserted through the mounting sheet slit 34 of its associated column so as to be received against the back side 40 of the mounting sheet. A right lateral edge 42 of each card 32 is subsequently inserted between the associated transparent retaining strip 36 and the front mounting sheet side 32 so that the cooperable action of the slit and the retaining strip locates the card on the mounting sheet. Vertical adjustment of the cards 32 along the columns is possible by sliding the cards along the mounting sheet so that the top end 44 of each card is properly located with respect to the mounting sheet and any card above it. Also, it should be noted that the slits 34 and retaining strips 36 extend downwardly further than the size of the page to be photographed so as to be capable of accommodating cards whose distance between their top ends 44 and bottom ends 46 is much greater than the card size needed to carry the printed matter on the cards. Thus, even though any one card may only have an inch or so of printed matter on it adjacent its top end 44, all of the cards may have the same height between their top and bottom ends. Cards 32 can be reused due to the manner in which they are secured to the mounting sheet by the slit and transparent retaining sheet securement and the uniform card size allows them to be stored in filing drawers or boxes and reused for different publications. Thus, a card carrying an autobiography of Thomas Edison might first be used in a publication compiling inventors of electrical inventions and then subsequently used in a publication compiling famous inventors of inventions made between the years 1875 and 1900. Likewise, the cards can bear printed matter for "classified sections" or "want ads" of a newspaper, and can be reused with different issues thereof if the advertiser so desires.

Retention of the cards 32 to the mounting sheet 12 is enhanced by a retaining sheet 48 of a rectangular shape that is secured to the back side 40 of the mounting sheet. Glue or paste is used to bond the retaining sheet 48 to the mounting sheet along vertically elongated areas 50 shown best in FIG. 1. The two bonded areas 50 closest to the left mounting sheet side 18 are respectively located to the left of the slits 34 on the opposite sides thereof as the associated transparent retaining strips 36. During insertion of the left card edges 38 through the slits 34, the cards are thus inserted between the retaining sheets 48 and the back sides 40 of the mounting sheet in a sandwiched relationship that functions to prevent card movement. It is preferable to have the right vertical edge of each bonded area 50 spaced to the left of its associated transparent retaining strip 36 to a distance just slightly greater than the lateral card width between its left and right edges 38 and 42. This spacing allows each card to remain generally planar as it is inserted through the slit 34 by initial movement toward the left and then inserted under the retaining strip 36 by a subsequent movement toward the right.

Figure 3:
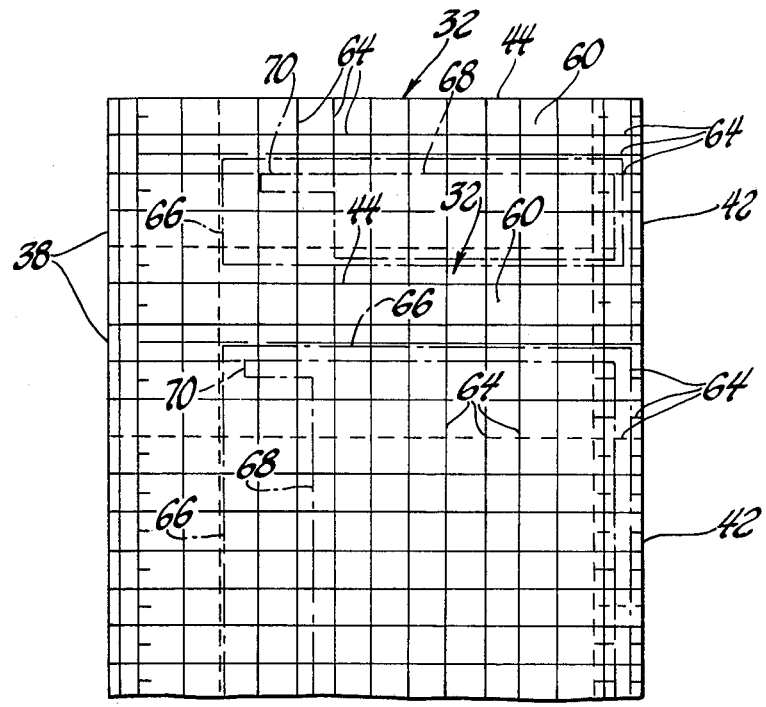
FIG. 3 is an enlarged view showing cards of the page model with pieces of paper secured thereto and having printed matter thereon as shown by phantom line representation.
Figure 4:
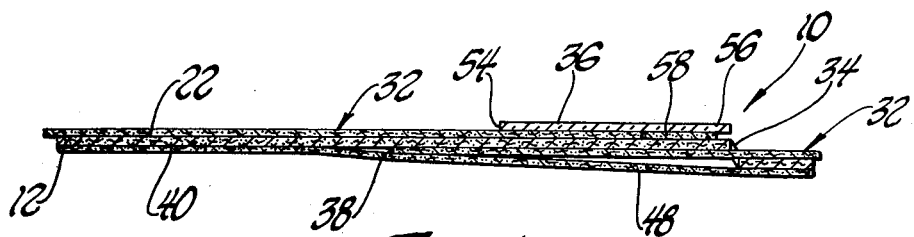
FIG. 4 is an enlarged portion of FIG. 2 illustrating the manner in which the cards are secured to the mounting sheet.
Figure 5:
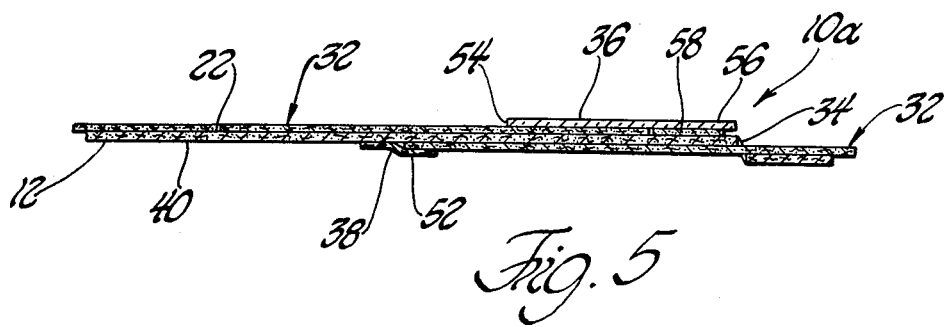
FIG. 5 is a view similar to FIG. 4 of another embodiment of the page model.

Another preferred page model embodiment 10a shown in FIG. 5 is the same as the embodiment of FIGS. 1–4 except as will be noted and therefore has like reference numerals identifying like components thereof and much of the previous discussion is applicable. However, tape 52 is utilized with the page model 10a in order to secure the left card edge 38 inserted through the slit 34 to the back side 40 of the mounting sheet 12. Tape 52 is not applied until after insertion of all cards 32 of the associated vertical column on the page model. After composition of this page model and photographing of the cards 32 retained on the front side of the mounting sheet 12 thereof, the tape 52 is removed so that the cards can be retrieved for reuse at a later time.

As seen by combined reference to FIGS. 1, 2, and 4, each transparent retaining strip 36 has a free left edge 54 under which the right card edges 42 are inserted and a right edge portion 56 that is secured to the mounting sheet by an elongated strip 58 of double-sided tape. Retaining strips 36 are made of clear acetate which is somewhat flexible so that the left edge 54 thereof can be moved away from the mounting sheet 12 in order to receive the card edges. Tape strips 58 are also transparent so as not to show on the photographic plates that are prepared from the page model. As the cards are inserted under the retaining strip 36 and moved toward the right, the right card edges 42 move up against the left-hand edge of the tape strip 58 and are thereby positioned in alignment with each other along their right edges. As shown in the sectional views of FIGS. 2 and 4 illustrating page model 10 and the sectional view of FIG. 5 illustrating page model 10a, only one card 32 is illustrated as being received under the tape 54 at each vertical position; however, it is understood that, depending upon the vertical location, there may be several cards at any one place received between the lower side of the retaining strip and the front side of the mounting sheet 12. Likewise, more than one left card edge 38 will be secured to the back side 40 of the mounting sheet at any one location by either the retaining sheet 48 of page model 10 or the tape 52 of page model 10a.

As seen by combined reference to FIGS. 1 and 3, non-photographic indicia is provided on the front side 22 of the mounting sheet 12 as well as on the front sides 60 of cards 32. On the mounting sheet 12, the indicia takes the form of various horizontal and vertical lines and marks all of which are indicated by reference numeral 62. On the front sides 60 of the cards 32, the indicia takes the form of horizontal and vertical lines and marks 64. Closer spacing of the indicia 62 on the mounting sheet is provided at its top end 14 as compared to the rest of the mounting sheet since this is the area where the first card 32 is positioned with the subsequent cards 32 being positioned over its bottom end 46 and alignment thereof can be achieved in relationship to the already retained higher card positioned by the closer spaced indicia. Likewise, as shown in FIG. 3, the indicia 64 at the right-hand card edge 42 is also closer spaced to insure that the cards are properly aligned with the mounting sheet as well as with each other along a vertical direction. As seen in this view, each card 32 has a piece of paper 66 pasted or glued to its front side 60 with printed matter 68 on it. The pieces of paper 66 are located so that the right sides of the printed matter 68 terminate in vertical alignment with each other regardless of the location of their left sides. Thus, the head note lines 70 of the printed matter 68 may not being at the same place but a uniform termination of the printed matter at the right side of the column is achieved. Each lower card is aligned so that its upper end 44 is spaced uniformly from the lower extremity of the printed matter 68 on the adjacent upper card with the same spacing between each insertion of printed matter.

A further embodiment of the page model is indicated by 10b in FIGS. 6 and 7 and is similar to the embodiment of FIGS. 1-4 such that like reference numerals are utilized and the previous description is applicable to this embodiment except as is noted. Each card edge retainer of this embodiment includes one of the vertically extending slits 34 through the mounting sheet 12 so that there are two such slits associated with each vertical column 28 and 30. Thus, the left and right edges 38 and 42 of each card 32 are inserted through the associated mounting sheet slits 34 to the back side of the mounting sheet during retention of the card. Vertical sliding movement of the card is permitted to adjust its vertical position with respect to the mounting sheet and each other card so that there is proper alignment of the printed matter in the manner previously discussed.

The page model embodiment 10b of FIGS. 6 and 7 includes a retaining sheet 48 that is secured to the back side 40 of the mounting sheet 12 at bonded areas 72 (FIG. 7) which extend vertically parallel to the slits 34. Folds 74 are provided in the retaining sheet 48 at each of its lateral sides along the adjacent bonded area 72 so as to receive the adjacent lateral card edge which is inserted through the adjacent mounting sheet slit 34. A double fold 76 of the retaining sheet 48 is located adjacent the two mounting sheet slits 34 between the vertical columns 28 and 30. Tape 78 maintains the configuration of the double fold 76 as shown. The right edges 42 of cards 32 in the left column 28 are inserted through the right slit 34 into the lower portion of the double fold as shown in FIG. 7. Left card edges inserted from column 30 first through the left slit 34 thereof are also inserted through a slit 80 of the double fold 76 so as to be received thereby above the adjacent card edges of the left column. Folds 74 and 76 thus cooperate by receiving card edges in securing the cards to the mounting sheet. Also, a strip of adhesive material 82 associated with each column 28 and 30 is utilized to further secure the cards 32. This adhesive material may be wax such that pressure applied to the front card sides 60 once in place bonds the cards to the wax and thus further secures the cards to the mounting sheet. Each strip of adhesive material is located between the card retainers provided by the two vertically extending slits 34 of the associated column extending parallel thereto generally midway between the slits. Of course, this adhesive material may be also utilized with the embodiments 10 and 10a of FIGS. 1-5 in a similar manner.

A still further of the embodiment of the page model is shown in FIGS. 8 and 9 and identified by reference numeral 10c. Much of the description of the previous embodiments is also applicable to this one and like numerals have best been applied thereto to identify similar elements and portions of it. Each vertical column 28 and 30 of the page model has card edge retainers in the form of the transparent retaining strips 36 at each column side. Each retaining strip is secured to the front side 22 of the mounting sheet by a double-sided tape strip 54 located midway between the edges 54 and 56 of the retaining strip. During mounting of the cards 32, the left and right card edges 38 and 42 are inserted under the free edges 54 and 56 of the associated retaining strips so as to be secured in position. The retaining strip 36 between the two columns 28 and 30 secures the adjacent card edges the adjacent card edges of both columns. Pressure applied to the front side 60 of the cards 32 bears on the adhesive wax material strip 82 to cooperate with the retaining strips 36 in securing the cards in position once they are properly placed.

While preferred embodiments of the page model have herein been described, those skilled in the art will recognize various alternative designs and embodiments for practicing the present invention as defined by the following claims.

What is claimed is:

1. A page model for use in printing comprising: a mounting sheet having front and back sides with at least one vertical column on the front side thereof; a plurality of rectangular cards having front sides for receiving printed matter thereon; each card having opposite lateral edges; and first and second vertically extending card retainers spaced laterally from each other on the mounting sheet at opposite lateral sides of the column so as to slidably support the opposite lateral card edges so each card can be positioned vertically just below the printed matter on the next higher card.

2. A page model as claimed in claim 1 wherein one of the card retainers comprises: a vertical slit in the mounting sheet such that the lateral card edges retained thereby can be inserted therethrough to the back side of the mounting sheet.

3. A page model as claimed in claim 2 further including a retaining sheet secured to the back side of the mounting sheet to cooperate with the slit in securing the card edges inserted therethrough.

4. A page model as claimed in claim 2 further including tape for securing the card edges inserted through the slit to the back side of the mounting sheet.

5. A page model as claimed in claim 2 wherein the other card retainer comprises a transparent retaining strip secured to the front side of the mounting sheet and having a free edge that is movable away from the mounting sheet to receive the card edges therebetween.

6. A page model as claimed in claim 5 further including a strip of transparent double-sided tape that secures the transparent retaining strip to the front side of the mounting sheet and provides a stop for the card edges that aligns the cards vertically along the column.

7. A page model as claimed in claim 2 wherein the other card retainer also comprises another vertical slit through the mounting sheet so that the card edges retained thereby can be inserted therethrough to the back side of the mounting sheet.

8. A page model as claimed in claim 7 further including a retaining sheet secured to the back side of the mounting sheet and cooperable with the slits therethrough in securing the card edges 9. A page model as claimed in claim 8 wherein the retaining sheet includes folds that receive the card edges.

10. A page model as claimed in claim 9 wherein the mounting sheet has at least two adjacent vertical columns on the front side thereof and includes two adjacent slits through which the adjacent lateral card edges of the two columns are inserted, the retaining sheet including a double fold at said two adjacent slits, and a vertical slit through the double fold which allows the adjacent lateral card edges of the two columns to be received and secured by the double fold in cooperation with the slits in the mounting sheet.

11. A page model as claimed in claim 1 wherein each card retainer comprises a transparent retaining strip secured to the front side of the mounting sheet and having a free edge movable away from the mounting sheet to receive the card edges therebetween.

12. A page model as claimed in claim 11 wherein each card retainer includes a strip of transparent double-sided tape for securing the transparent retaining strip thereof to the mounting sheet.

13. A page model as claimed in claim 11 wherein one of the retaining strips includes a pair of free edges movable away from the mounting sheet to receive card edges therebetween from two adjacent vertical columns on the mounting sheet.

14. A page model as claimed in claim 1 further including a strip of adhesive material for cooperating with the retainers in securing the cards.

15. A page model as claimed in claim 14 wherein the strip of adhesive material is of wax.

16. A page model as claimed in claim 14 wherein the strip of adhesive is located on the front side of the mounting sheet spaced between the card retainers thereof.

17. A page model as claimed in claim 1 wherein the front sides of the mounting sheet and the cards have indicia thereon for aligning the cards on the mounting sheet.

18. A page model for use in printing comprising a mounting sheet having front and back sides with at least one vertical column on the front side thereof; a plurality of rectangular cards having front sides for receiving printed matter thereon; each card having opposite lateral edges; a first card retainer including a vertical slit in the mounting sheet through which card edges are inserted at one side of the column to the back side of the mounting sheet; a second card retainer including a vertically extending transparent retaining strip secured to the front side of the mounting sheet on the other side of the column in laterally spaced relationship to the slit and having a free edge movable away from the mounting sheet to receive the card edges therebetween at the other side of the column; and a retaining sheet secured to the back side of the mounting sheet to cooperate with the slit in securing the card edges inserted therethrough to the back side of the mounting sheet.

19. A page model for use in printing comprising: a mounting sheet having front and back sides with at least one vertical column on the front side thereof; a plurality of rectangular cards having front sides for receiving printed matter thereon; each card having opposite lateral edges a first card retainer including a vertical slit in the mounting sheet through which card edges are inserted at one side of the column to the back side of the mounting sheet; a second card retainer including a vertically extending transparent retaining strip secured to the front side of the mounting sheet on the other side of the column in laterally spaced relationship to the slit and having a free edge movable away from the mounting sheet to receive the card edges therebetween at the other side of the column; and tape for securing the card edges inserted through the slit to the back side of the mounting sheet so as to cooperate with the slit and the transparent retaining strip in securing the cards.

20. A page model for use in printing comprising: a mounting sheet having front and back sides with at least two vertical columns on the front side thereof; a plurality of rectangular cards having front sides for receiving printed matter thereon; each card having opposite lateral edges each column on the mounting sheet having an associated pair of card retainers including respective vertical slits in the mounting sheet at opposite lateral sides of the column in laterally spaced relationship to each other, the card edges being inserted through the slits to the back side of the mounting sheet such that each card is vertically positioned just below the printed matter on the next higher card; and a retaining sheet secured to the back side of the mounting sheet and having a double fold at two adjacent slits of said two columns on the mounting sheet, the retaining sheet having a slit therethrough at the double fold such that cards from each column have edges thereof inserted through said two adjacent slits in the mounting sheet with the card edges associated with one column also inserted through the slit in double fold such that the card edges associated with both columns are received by the double fold, and the retaining sheet including two other folds for receiving the other card edges inserted through the other slits to the back side of the mounting sheet.

21. A page model for use in printing comprising: a mounting sheet having front and back sides with at least two adjacent vertical columns on the front side thereof; a plurality of rectangular cards having front sides for receiving printed matter thereon; each card having opposite lateral edges; a first card retainer including a transparent retaining strip secured to the front side of the mounting sheet and having a pair of free edges movable away from the mounting sheet to receive card edges from each column therebetween; and two second card retainers including respective vertically extending transparent retaining strips secured to the front side of the mounting sheet at the other sides of the respective columns in laterally spaced relationship to the first card retainer strip and having free edges movable away from the mounting sheet to receive the other card edges therebetween such that the retainers slidably support the cards so each can be positioned just below the printed matter on the next higher card.

22. A page model as claimed in claim 21 wherein each card retainer includes a strip of transparent double-sided tape securing the transparent retaining strip thereof to the front side of the mounting sheet.

* * * * *